(12) United States Patent
Tu et al.

(10) Patent No.: US 9,293,488 B2
(45) Date of Patent: Mar. 22, 2016

(54) IMAGE SENSING DEVICE

(71) Applicant: VisEra Technologies Company Limited, Hsin-Chu (TW)

(72) Inventors: Zong-Ru Tu, Keelung (TW); Yu-Kun Hsiao, Hsin-Chu (TW)

(73) Assignee: VisEra Technologies Company Limited, Hsin-Chu (TW)

( * ) Notice: Subject to any disclaimer, the term of this patent is extended or adjusted under 35 U.S.C. 154(b) by 0 days.

(21) Appl. No.: 14/271,815

(22) Filed: May 7, 2014

(65) Prior Publication Data

US 2015/0325612 A1 Nov. 12, 2015

(51) Int. Cl.
*H01L 31/0232* (2014.01)
*H01L 27/146* (2006.01)

(52) U.S. Cl.
CPC .... *H01L 27/14621* (2013.01); *H01L 27/14625* (2013.01); *H01L 27/14627* (2013.01)

(58) Field of Classification Search
CPC ............ H01L 27/432; H01L 27/14621; H01L 27/14625
See application file for complete search history.

(56) References Cited

U.S. PATENT DOCUMENTS

| 8,355,072 B2 * | 1/2013 | Ogino et al. .................. 348/340 |
| 2005/0190453 A1 * | 9/2005 | Dobashi ......................... 359/619 |
| 2006/0138577 A1 * | 6/2006 | Hashimoto .................... 257/432 |
| 2007/0187733 A1 * | 8/2007 | Fellous ................ G02B 6/1221 257/292 |
| 2007/0187793 A1 * | 8/2007 | Moon .................... G02B 5/201 257/440 |
| 2007/0200055 A1 * | 8/2007 | Reznik et al. ............... 250/208.1 |
| 2010/0096718 A1 * | 4/2010 | Hynecek et al. .............. 257/460 |
| 2010/0164039 A1 * | 7/2010 | Song ................ H01L 27/14629 257/432 |

FOREIGN PATENT DOCUMENTS

| JP | 2006-140413 A | 6/2006 |
| JP | 2011-205141 A | 10/2011 |
| JP | 2012-124377 A | 6/2012 |
| JP | 2013-16687 A | 1/2013 |
| WO | WO 2013/031160 A1 | 3/2013 |

OTHER PUBLICATIONS

Office Action of corresponding JP patent application No. 2014-194610 issued on Dec. 7, 2015 with English translation (8 pgs).

* cited by examiner

*Primary Examiner* — Brett Feeney
*Assistant Examiner* — Sarah Salerno
(74) *Attorney, Agent, or Firm* — Muncy, Geissler, Olds & Lowe, P.C.

(57) ABSTRACT

An image sensing device includes: a semiconductor substrate with a photo-sensing element; a passive layer disposed over the semiconductor substrate, having a first refractive index; a color pattern disposed over the passive layer, wherein the color pattern aligns to the photo-sensing element and has a color selected from the group consisting of red (R), green (G), blue (B), and white (W), and a second refractive index; and an electromagnetic wave guiding element disposed in at least one of the color pattern and the passive layer, having a third refractive index, and the third refractive index is greater than the first refractive index or the second refractive index, and a first difference between the third refractive index and the first refractive index is at least 0.2, and a second difference between the third refractive index and the second refractive index is at least 0.2.

21 Claims, 15 Drawing Sheets

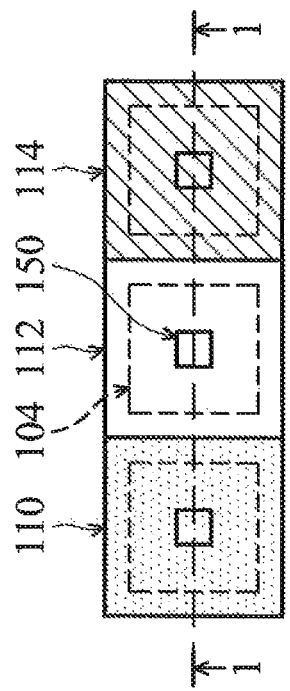
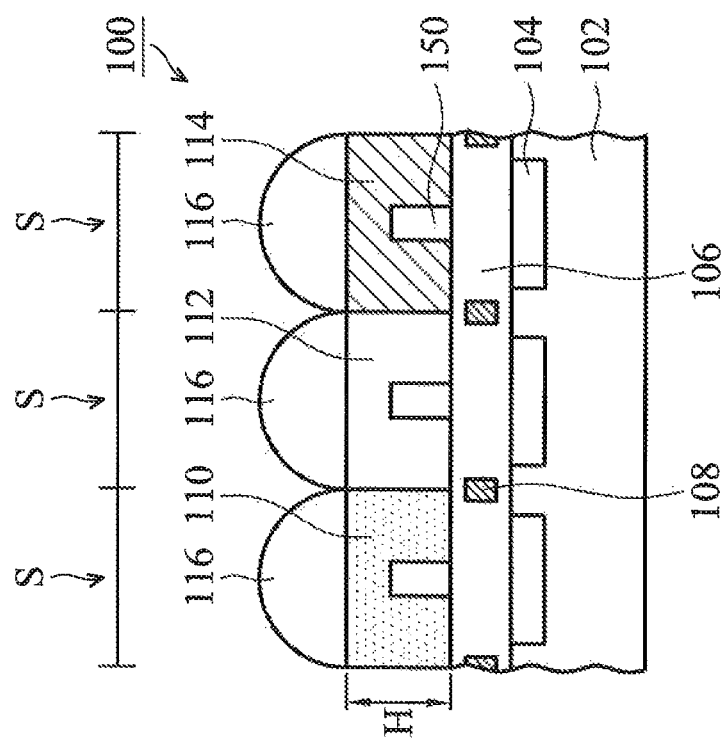
FIG. 2
FIG. 1

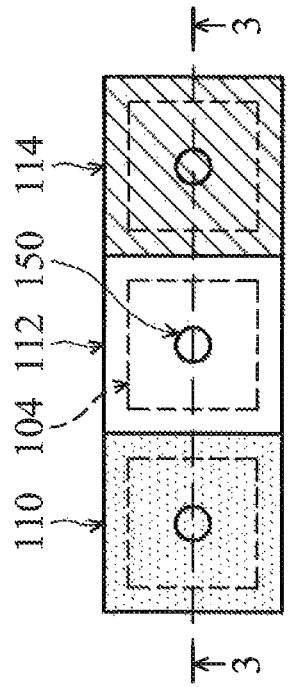
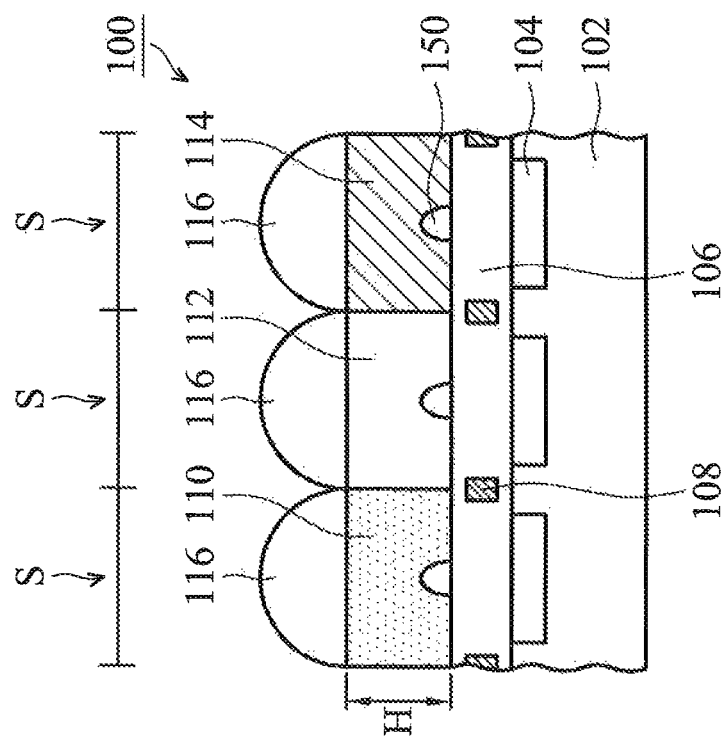
FIG. 4
FIG. 3

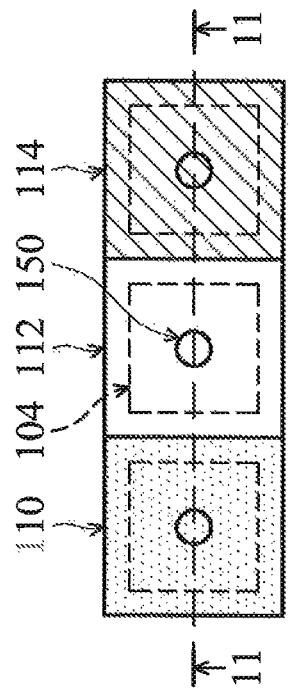
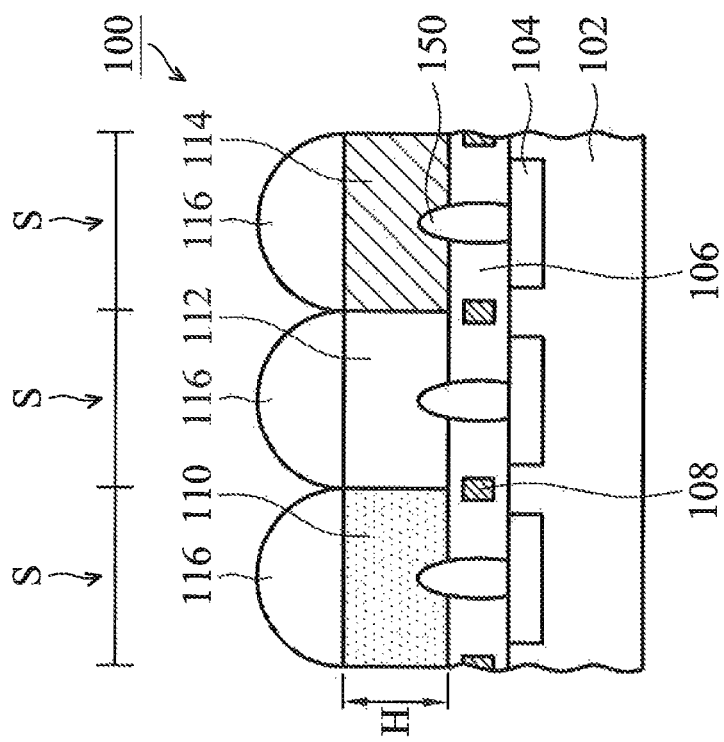
FIG. 12
FIG. 11

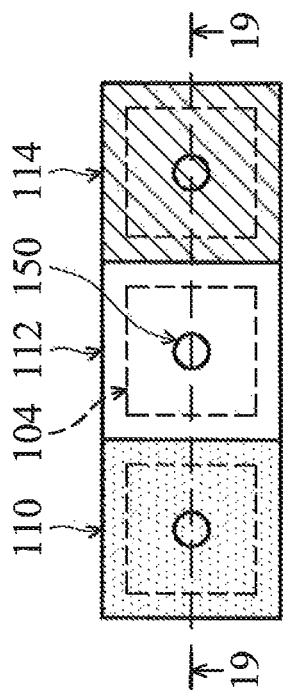
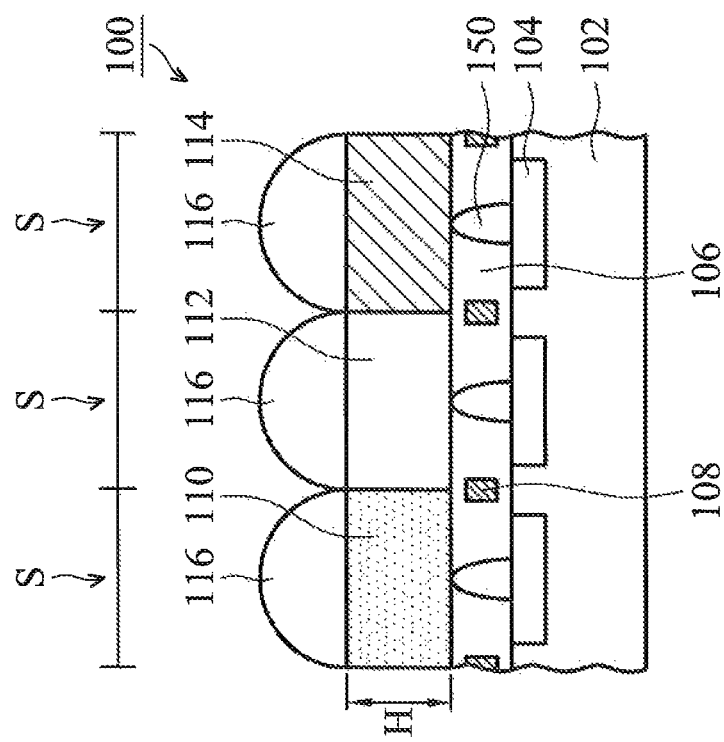
FIG. 19
FIG. 20

IMAGE SENSING DEVICE

BACKGROUND OF THE INVENTION

1. Field of the Invention

The present invention relates to image sensing devices, and more particularly to an image sensing device having reduced energy dispersal taking place between adjacent pixels.

2. Description of the Related Art

Image sensing devices are necessary components in many optoelectronic devices, including digital cameras, cellular phones, and toys. Conventional sensing devices include both charge coupled device (CCD) image sensors and complementary metal oxide semiconductor (CMOS) image sensors.

An image sensing device typically includes a plane array of pixel cells, wherein each pixel cell comprises a photogate, a photoconductor or a photodiode having a doped region for accumulating a photo-generated charge. A periodic pattern of dyes of different colors such as red (R), green (G), or blue (B) is superimposed over the plane array of pixel cells. This pattern is known as a color filter array (CFA). A plurality of microlenses of a square or a circular shape can be optionally superimposed over the color filter array (CFA) to focus light onto one initial charge accumulation region of each of the pixel cells. Using the microlenses may significantly improve the photosensitivity of the image sensor.

However, due to the trend of reducing the size of the pixel cells in image sensing devices, the energy (i.e. electromagnetic wave) of incident light passes through the microlens and focuses at the center of one of the pixels, which may thus disperse or refract into a pixel adjacent thereto, thereby causing a malfunction and a reduction of the sensitivity of the pixel cells in the image sensing device.

BRIEF SUMMARY OF THE INVENTION

Accordingly, image sensing devices are provided to eliminate or reduce the malfunctions and reductions of the sensitivity of the pixel cells of the image sensing device caused by the energy (i.e. electromagnetic wave) dispersal of incident light which can happen between adjacent pixels in image sensing devices.

An exemplary image sensing device comprises: a semiconductor substrate with a photo-sensing element and a passive layer disposed over the semiconductor substrate, having a first refractive index. A color pattern is disposed over the passive layer, wherein the color pattern aligns to the photo-sensing element and has a color selected from the group consisting of red (R), green (G), blue (B), and white (W), and a second refractive index. An electromagnetic wave guiding element is disposed in at least one of the color pattern and the passive layer, wherein the electromagnetic wave guiding element has a third refractive index, and the third refractive index is greater than the first refractive index or the second refractive index, and a first difference between the third refractive index and the first refractive index is at least 0.2, and a second difference between the third refractive index and the second refractive index is at least 0.2.

In one embodiment, the image sensing device further comprises an anti-current leakage layer disposed between the color pattern and the passive layer, having a fourth refractive index, and the third refractive index is greater than the fourth refractive index, with a difference of at least 0.2 therebetween.

In another embodiment, the image sensing device further comprises an anti-reflection layer disposed between the color pattern and the passive layer, having a fifth refractive index, and the third refractive index is greater than the fourth refractive index, with a difference of at least 0.2 therebetween.

In yet another embodiment, the image sensing device further comprises an under layer disposed between the microlens and the color pattern.

In another embodiment, the image sensing device further comprises an anti-reflection layer disposed over the microlens.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 1 is a schematic cross section showing an image sensing device according to an embodiment of the invention;

FIG. 2 is a schematic top view showing the image sensing device in FIG. 1;

FIG. 3 is a schematic cross section showing an image sensing device according to another embodiment of the invention;

FIG. 4 is a schematic top view showing the image sensing device in FIG. 3;

FIG. 11 is a schematic cross section showing an image sensing device according to another embodiment of the invention;

FIG. 12 is a schematic top view showing the image sensing device in FIG. 11;

FIG. 19 is a schematic cross section showing an image sensing device according to another embodiment of the invention;

FIG. 20 is a schematic top view showing the image sensing device in FIG. 19;

DETAILED DESCRIPTION OF THE INVENTION

Figure 6:
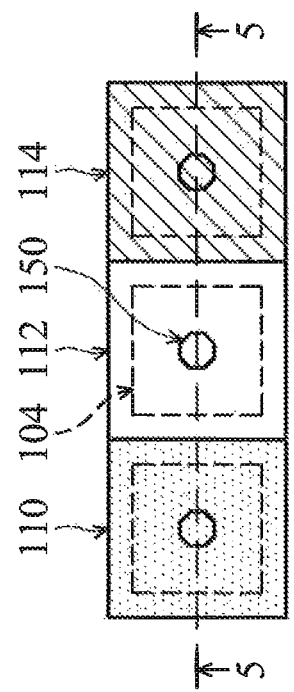
FIG. 6 is a schematic top view showing the image sensing device in FIG. 5.

The following description is of the best-contemplated mode of carrying out the invention. This description is made for the purpose of illustrating the general principles of the invention and should not be taken in a limiting sense. The scope of the invention is best determined by reference to the appended claims.

FIG. 1 is schematic cross section showing an exemplary image sensing device 100. The image sensing device 100 comprises a semiconductor substrate 102 with a plurality of photo-sensing elements 104 formed therein, a passive layer 106 with a plurality of light shielding metals 108 formed therein over the semiconductor substrate 102, a plurality of electromagnetic-wave guiding elements 150 over the passive layer 106, a plurality of color patterns 110, 112, and 114 over the passive layer 106, and a plurality of microlenses 116 over the color patterns 110, 112, and 114.

As shown in FIG. 1, the semiconductor substrate 102 can be, for example, a silicon substrate, and the photo-sensing elements 104 can be, for example, photodiodes separately formed in the semiconductor substrate 102. The passive layer 106 can be a single layer or a composite layer comprising dielectric materials (not shown) and conductive elements (not shown) for forming, for example, interconnect structures (not shown) between the photo-sensing elements 104 and external circuits (not shown) but not comprising photo-sensing elements therein. The light shielding metals 108 in the passive layer 106 are respectively formed over the semiconductor substrate 102 at a place not covering the photo-sensing elements 104 therein, thereby defining light-shielding areas for shielding the area of the pixel except for the area of the photo-sensing elements 104 and defining opening areas exposing the area of the photo-sensing elements 104. In addition, the electromagnetic-wave guiding elements 150 over the passive layer 106 are formed over one of the photo-sensing elements 104 at a place substantially over a central portion of the one of the photo-sensing elements 104 thereunder.

Moreover, as shown in FIG. 1, the color patterns 110, 112, and 114 over the passivation layer 106 are also formed over one of the photo-sensing elements 104 to entirely cover one of the electromagnetic-wave guiding elements 150 over the passive layer 106 and align to the one of the electromagnetic-wave guiding elements 150, respectively. The microlenses 116 over the color patterns 110, 112, and 114 are formed over one of the photo-sensing elements 104. In one embodiment, the color patterns 110, 112, and 114 may comprise photosensitive type color resists of the same color or different colors selected from the group consisting of red (R), green (G), blue (B), and white (W), and may be formed by, for example, spin coating and a photolithography process.

As shown in FIG. 1, the electromagnetic-wave guiding elements 150 are formed with a rectangular stud-like cross section, and may comprise any light-transmitting materials. The refractive index (n) of the electromagnetic-wave guiding elements 150 is greater than that of the color patterns 110, 112, and 114 adjacent thereto, and may have a difference of at least 0.2 therebetween. In one embodiment, the refractive index (n) of the electromagnetic-wave guiding elements 150 and the refractive index (n) of the color patterns 110, 112, and 114 have a difference of about 0.2-1.3 therebetween. In addition, the top surface of the electromagnetic-wave guiding elements 150 may be lower than half of the height H of the color patterns 110, 112, and 114. The electromagnetic-wave guiding elements 150 can be formed over the passive layer 106 prior to formation of the color patterns 110, 112, and 114.

Accordingly, due to the formation of the electromagnetic-wave guiding elements 150 in the image sensing device 100, incident light (not shown) passing through the microlens 116 will be focused toward the underlying photo-sensing elements 104 and then guided by the electromagnetic-wave guiding element 150 formed in the color patterns 110, 112, or 114, and then be transmitted downwardly to the photo-sensing elements 104, such that the focused light will not be dispersed or refracted into the color pattern and/or the photo-sensing element of another pixel cell adjacent thereto while the critical size S of the pixel cells in the image sensing device 100 is further reduced. Therefore, functionality and sensitivity of the pixel cells of the image sensing device 100 can be ensured even as the the size of the pixel cells of the image sensing device 100 is reduced.

FIG. 2 is a schematic top view showing the image sensing device 100 in FIG. 1, and the schematic cross section of the image sensing device 100 in FIG. 1 is taken along line 1-1 in FIG. 2. For simplicity, only the photo-sensing elements 104, the color patterns 110, 112, and 114, and the electromagnetic-wave guiding elements 150 of the image sensing device 100 are shown in FIG. 2 for discussion. As shown in FIG. 2, the electromagnetic-wave guiding elements 150 are provided with a rectangular configuration from a top view. In addition, the electromagnetic-wave guiding elements 150 may have a surface area less than that of the photo-sensing elements 104, such that a ratio of the surface area of the electromagnetic-wave guiding elements 150 to the surface area of the photo-sensing elements 104 thereunder is less than 25%.

Configurations of the electromagnetic-wave guiding elements 150, however, are not limited by those shown in FIGS. 1-2, and the electromagnetic-wave guiding elements 150 may have other configurations in other exemplary image sensing devices.

FIG. 3 is a schematic cross section showing another exemplary image sensing device 100. Components in the image sensing device 100 shown in FIG. 3 are similar to those shown in FIG. 1, except that the electromagnetic-wave guiding elements 150 shown in FIG. 3 are formed with a semicircle-like configuration in the cross sectional view.

In addition, FIG. 4 is a schematic top view showing the image sensing device 100 in FIG. 3, and the schematic cross section of the image sensing device 100 in FIG. 3 is taken along line 3-3 in FIG. 4. For the purpose of simplicity, only the photo-sensing elements 104, the color patterns 110, 112, and 114, and the electromagnetic-wave guiding elements 150 of the image sensing device 100 are shown in FIG. 4 for discussion. As shown in FIG. 4, the electromagnetic-wave guiding elements 150 are provided with a circular configuration from the top view. In addition, the electromagnetic-wave guiding elements 150 may have a surface area less than that of the photo-sensing elements 104, such that a ratio of the surface area of the electromagnetic-wave guiding elements 150 to the surface area of the photo-sensing elements 104 thereunder is less than 25%.

Figure 5:
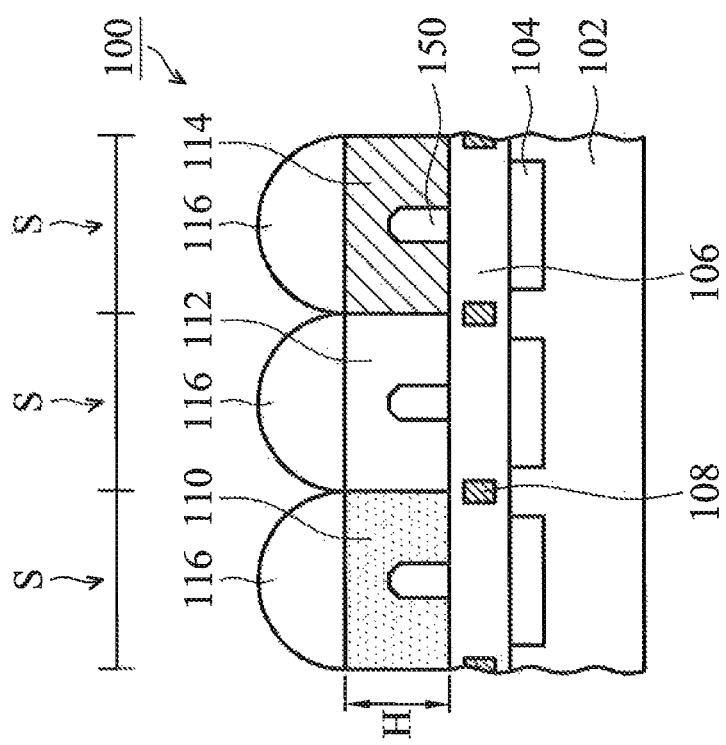
FIG. 5 is a schematic cross section showing an image sensing device according to yet another embodiment of the invention.

FIG. 5 is a schematic cross section showing yet another exemplary image sensing device 100. Components in the image sensing device 100 shown in FIG. 5 are similar to those shown in FIG. 1, except that the electromagnetic-wave guiding elements 150 shown in FIG. 5 are formed with a polygonal stud-like configuration in the cross sectional view.

In addition, FIG. 6 is a schematic top view showing the image sensing device 100 in FIG. 5, and the schematic cross section of the image sensing device 100 in FIG. 5 is taken along line 5-5 in FIG. 6. For the purpose of simplicity, only the photo-sensing elements 104, the color patterns 110, 112, and 114, and the electromagnetic-wave guiding elements 150 of the image sensing device 100 are shown in FIG. 6 for discussion.

As shown in FIG. 6, the electromagnetic-wave guiding elements 150 are provided with a polygonal (e.g. octagonal) configuration from the top view. In addition, the electromagnetic-wave guiding elements 150 may have a surface area less than that of the photo-sensing elements 104, such that a ratio of the surface area of the electromagnetic-wave guiding elements 150 to the surface area of the photo-sensing elements 104 thereunder is less than 25%.

Figure 7:
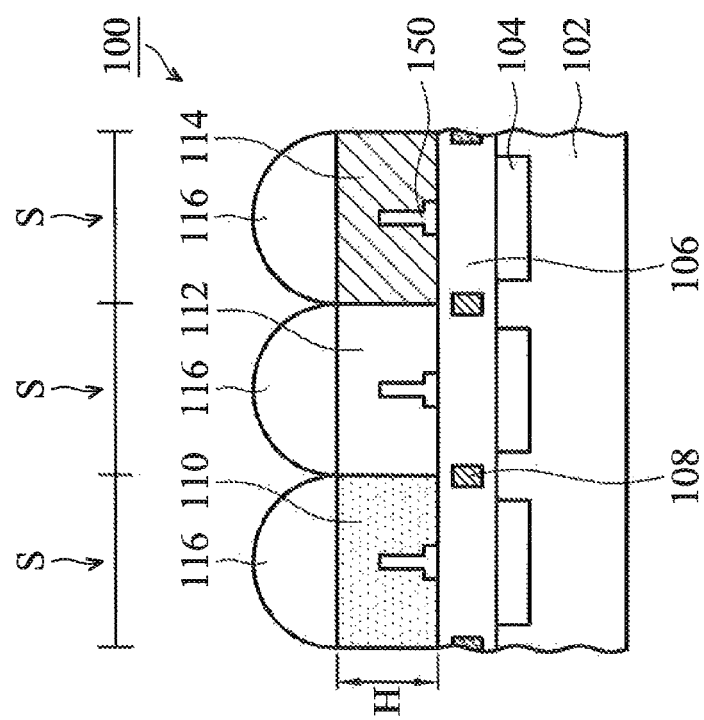
FIG. 7 is a schematic cross section showing an image sensing device according to another embodiment of the invention.
Figure 10:
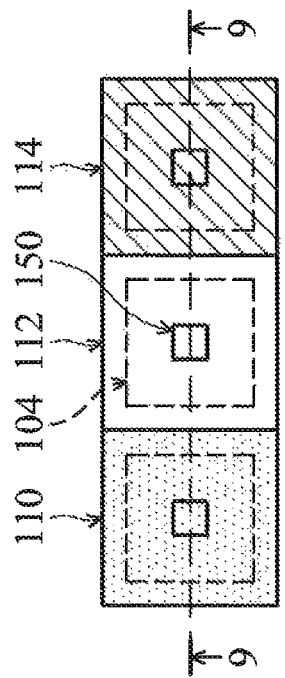
FIG. 10 is a schematic top view showing the image sensing device in FIG. 9.
Figure 9:
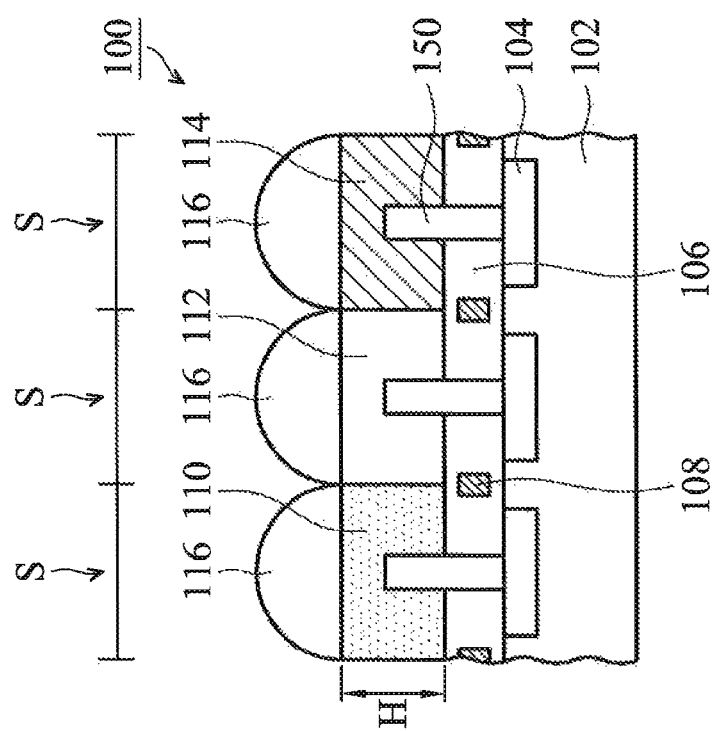
FIG. 9 is a schematic cross section showing an image sensing device according to yet another embodiment of the invention.
Figure 14:
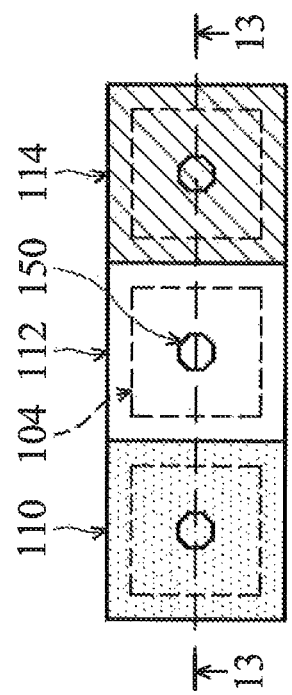
FIG. 14 is a schematic top view showing the image sensing device in FIG. 13.
Figure 13:
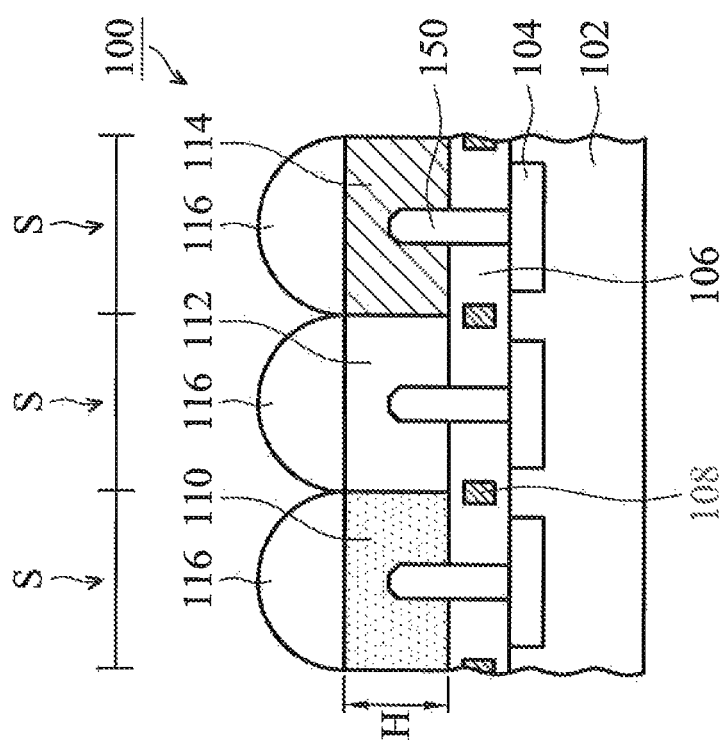
FIG. 13 is a schematic cross section showing an image sensing device according to yet another embodiment of the invention.
Figure 16:
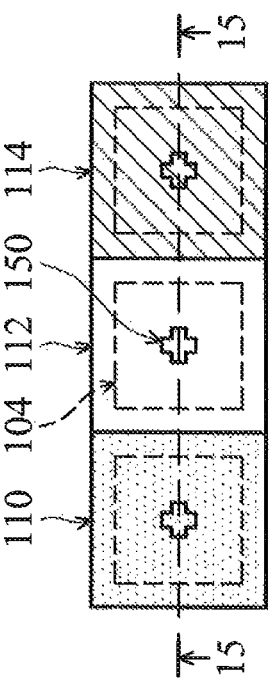
FIG. 16 is a schematic top view showing the image sensing device in FIG. 15.
Figure 15:
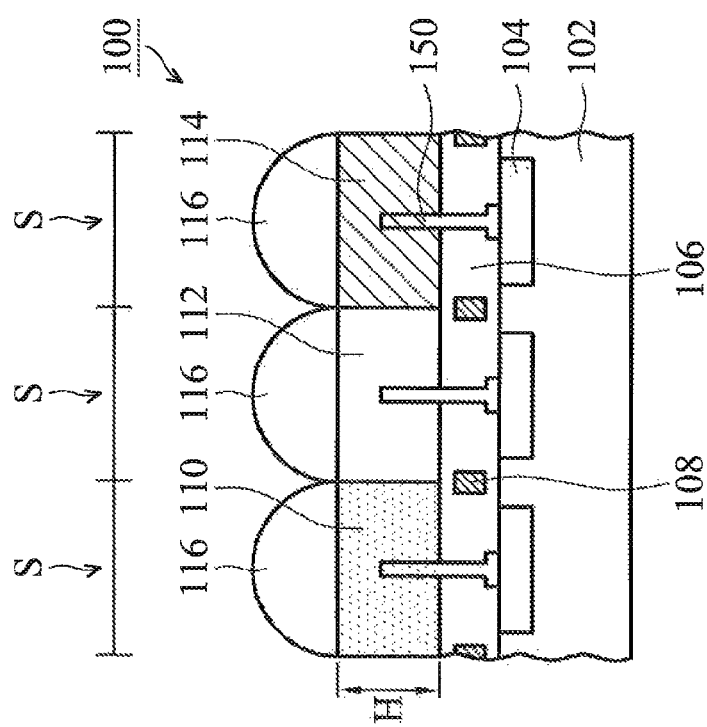
FIG. 15 is a schematic cross section showing an image sensing device according to another embodiment of the invention.
Figure 18:
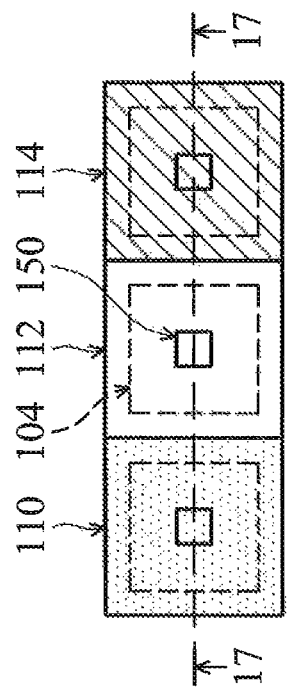
FIG. 18 is a schematic top view showing the image sensing device in FIG. 17.
Figure 17:
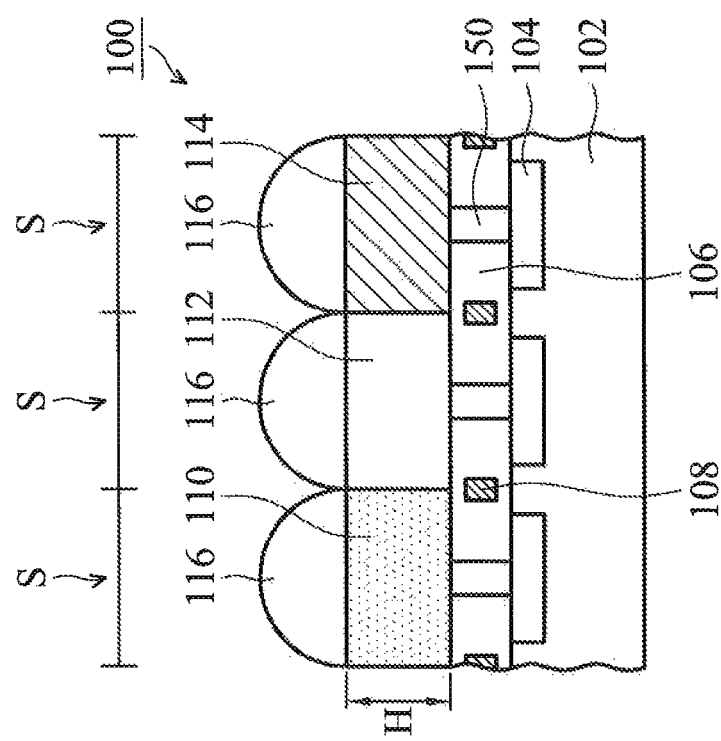
FIG. 17 is a schematic cross section showing an image sensing device according to yet another embodiment of the invention.
Figure 22:
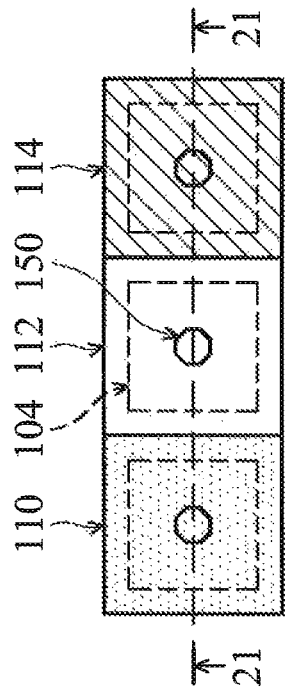
FIG. 22 is a schematic top view showing the image sensing device in FIG. 21.
Figure 21:
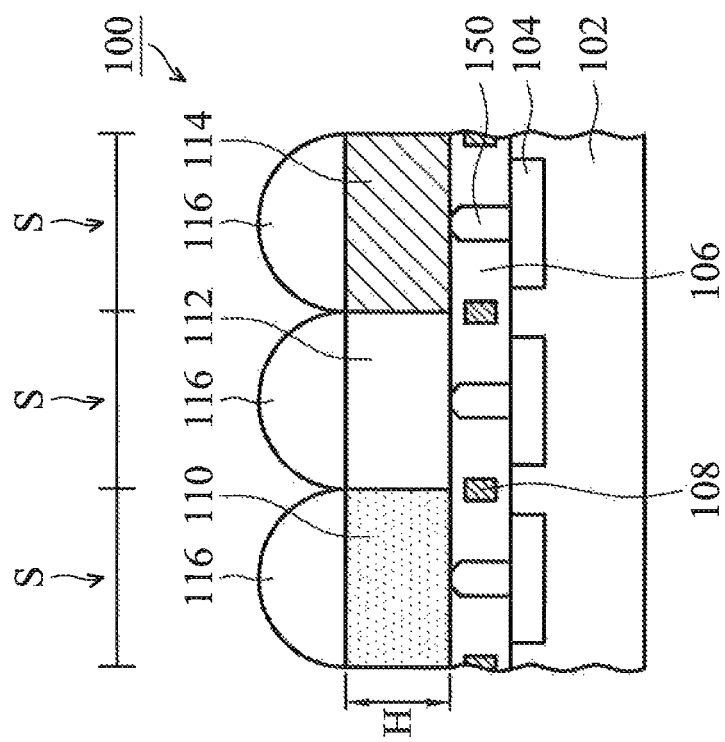
FIG. 21 is a schematic cross section showing an image sensing device according to yet another embodiment of the invention.
Figures 23, 24:
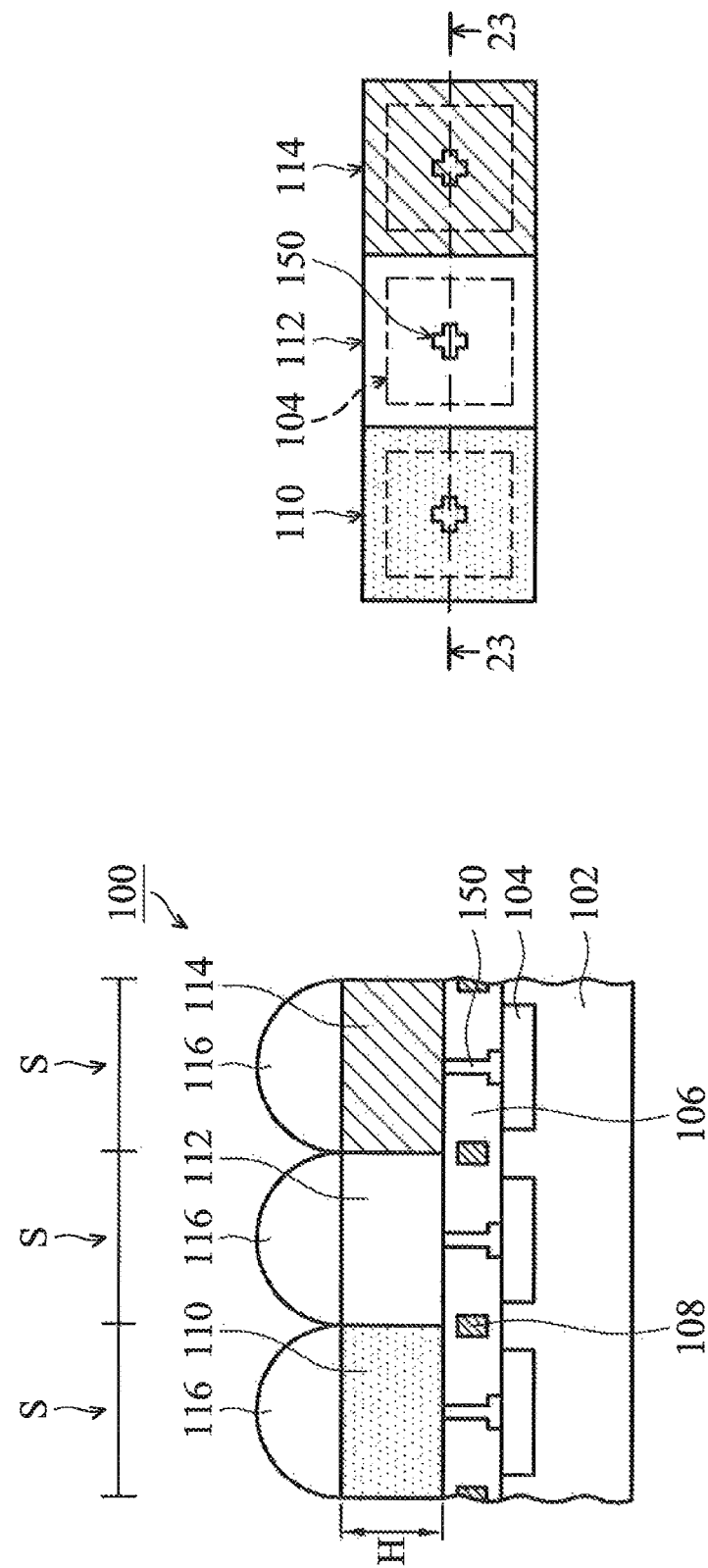
FIG. 23 is a schematic cross section showing an image sensing device according to yet another embodiment of the invention.
FIG. 24 is a schematic top view showing the image sensing device in FIG. 23.

FIG. 7 is a schematic; cross section showing another exemplary image sensing device 100. Components in the image sensing device 100 shown in FIG. 7 are similar to those shown in FIG. 1, except that the electromagnetic-wave guiding elements 150 shown in FIG. 7 are formed with a inverted T-like configuration in the cross sectional view.

Figure 8:
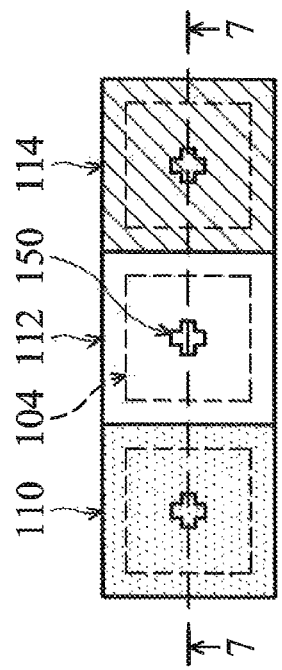
FIG. 8 is a schematic top view showing the image sensing device in FIG. 7.

In addition, FIG. 8 is a schematic top view showing the image sensing device 100 in FIG. 8, and the schematic cross section of the image sensing device 100 in FIG. 7 is taken along line 7-7 in FIG. 8. For simplicity, only the photo-sensing elements 104, the color patterns 110, 112, and 114, and the electromagnetic-wave guiding elements 150 of the image sensing device 100 are shown in FIG. 8 for discussion.

As shown in FIG. 8, the electromagnetic-wave guiding elements 150 are provided with a cross configuration from a top view. In addition, the electromagnetic-wave guiding elements 150 may have a surface area less than that of the photo-sensing elements 104, such that a ratio of the surface area of the electromagnetic-wave guiding elements 150 to the surface area of the photo-sensing elements 104 thereunder is less than 25%.

Moreover, configurations of locations the electromagnetic-wave guiding elements 150 are not limited by those shown in FIGS. 1-8, and the electromagnetic-wave guiding elements 150 may have other configurations and locations in other exemplary image sensing devices.

FIGS. 9, 11, 13, and 15 are schematic cross sectional views showing other exemplary image sensing devices 100. Components in the image sensing devices 100 shown in FIGS. 9, 11, 13, and 15 are similar to those shown in FIGS. 1, 3, 5, and 7, respectively, except that the electromagnetic-wave guiding elements 150 shown in FIGS. 9, 11, 13, and 15 are further extended downwardly into the passive layer 106, and each comes into contact with one of the underlying photo-sensing elements 104. FIGS. 10, 12, 14 and 16 are schematic top views showing the image sensing device 100 in FIGS. 9, 11, 13, and 15, respectively, and the schematic cross sectional views of the image sensing device 100 in FIGS. 9, 11, 13, and 15 are taken along line 9-9 in FIG. 10, line 11-11 in FIG. 12, line 13-13 in FIG. 14, and line 15-15 in FIG. 16, respectively.

Further, configurations of locations the electromagnetic-wave guiding elements 150 are not limited by those shown in FIGS. 1-8 and FIGS. 9-16, and the electromagnetic-wave guiding elements 150 may have other configurations and locations in other exemplary image sensing devices.

FIGS. 17, 19, 21, and 23 are schematic cross sectional views showing other exemplary image sensing devices 100. Components in the image sensing devices 100 shown in FIGS. 17, 19, 21, and 23 are similar to those shown in FIGS. 9, 11, 13, and 15, respectively, except that the electromagnetic-wave guiding elements 150 shown in FIGS. 17, 19, 21, and 23 remains in the passive layer 106, contacting the underlying photo-sensing elements 104, but do not extend upwardly into the color patterns 110, 112, and 114, respectively. FIGS. 18, 20, 22 and 24 are schematic top views showing the image sensing device 100 in FIGS. 17, 19, 21, and 23, respectively, and the schematic cross sectional views of the image sensing device 100 in FIGS. 17, 19, 21, and 23 are taken along line 17-17 in FIG. 18, line 19-19 in FIG. 20, line 21-21 in FIG. 22, and line 23-23 in FIG. 24, respectively.

Moreover, configurations of the image sensor devices are not limited by those shown in FIGS. 1-8, FIGS. 9-16, and FIGS. 17-24, and the additional components can be provided in the image sensing devices for improving functionality and/or sensitivity thereof.

Figure 25:
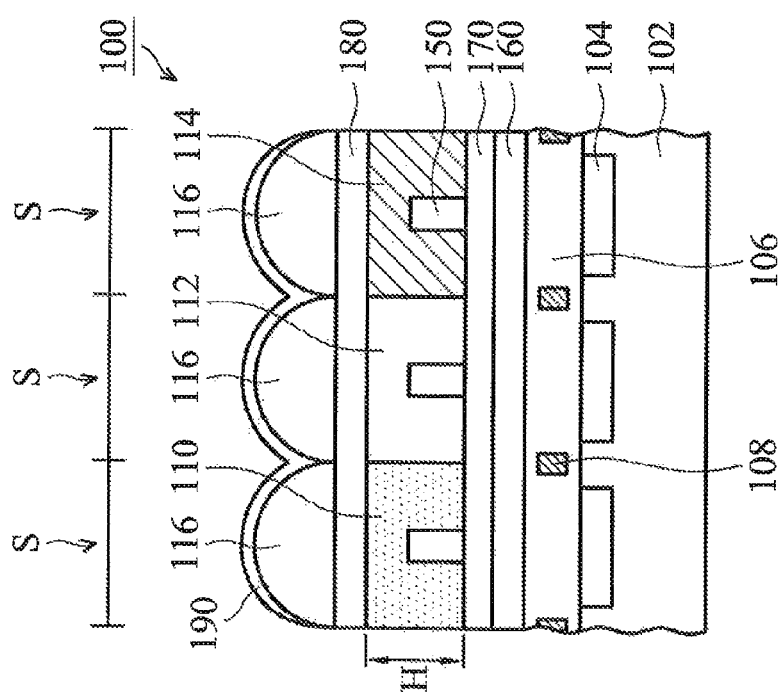
FIG. 25 is a schematic cross section showing an image sensing device according to another embodiment of the invention.

FIG. 25 is a schematic cross sectional view showing an exemplary image sensing device 100 with additional components other than those shown in FIGS. 1-8, FIGS. 9-16, and FIGS. 17-24. Components of the exemplary image sensing device 100 are similar to that shown in FIG. 1, except that an anti-current leakage layer 160, an anti-reflection layer 170, an under layer 180, and an anti-reflection coating 190 are optionally provided in the image sensing device shown in FIG. 25. In one embodiment, the anti-current leakage layer 160, the anti-reflection layer 170, the under layer 180, and the anti-reflection coating 190 can be formed with a single film or a film stack comprising a plurality of stacked films. The anti-current leakage layer 160, the anti-reflection layer 170, the under layer 180, and the anti-reflection coating 190 may be also provided in the image sensing device shown in FIGS. 3-8, FIGS. 9-16, and FIGS. 17-24 and are not illustrated here, for the purpose of simplicity. Once the anti-current leakage layer 160 and/or the anti-reflection layer 170 are optionally formed between the color patterns 110, 112, and 114, and the passive layer 160 of the exemplary image sensing devices shown in FIGS. 9-24, the electromagnetic-wave guiding elements 150 may be also formed in a portion of the anti-current leakage layer 160 and/or the anti-reflection layer 170. Similarly, in the exemplary image sensing devices comprising the electromagnetic-wave guiding elements 150 formed in the optional anti-current leakage layer 160 and/or the anti-reflection layer 170, an refraction index (n) of the electromagnetic-wave guiding elements 150 is greater than that of the optional anti-current leakage layer 160 and/or the anti-reflection layer 170, and have a difference of at least 0.2 therebetween.

As shown in FIG. 25, the anti-current leakage layer 160 and/or the anti-reflection layer 170 may be optionally formed between the color patterns 110, 112, and 114, and the passive layer 160, the under layer 180 may be optionally formed between the microlenses 116 and the color patterns 110, 112, and 114, and the anti-reflection coating 190 may be optionally formed over top surfaces of the microlenses 116.

Figure 26:
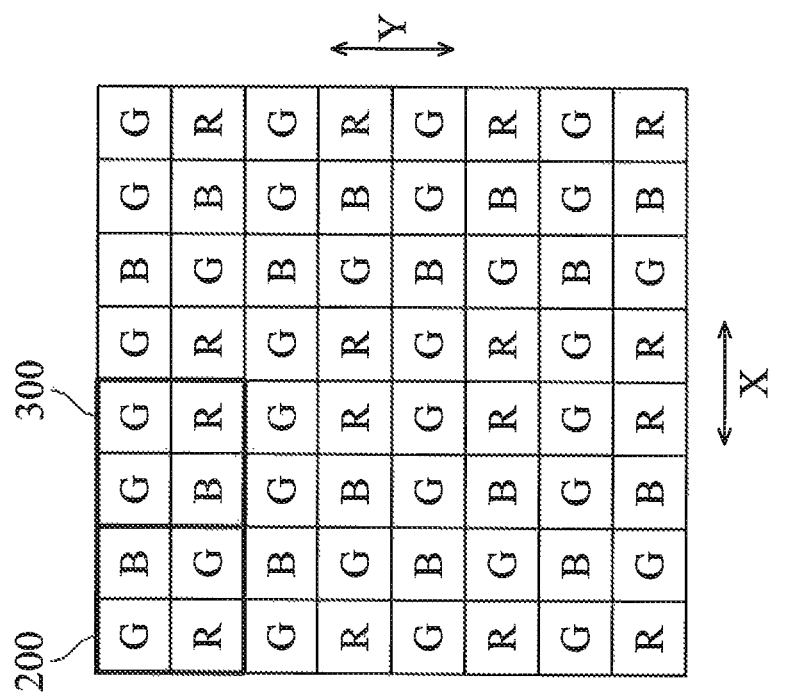
FIG. 26 is a schematic top view showing a color filter array for an image sensing device according to an embodiment of the invention.

FIG. 26 is a schematic top view showing an exemplary color filter array for the image sensing device as shown in FIGS. 1-25. As shown in FIG. 26, the color filter array may comprise a plurality of unit patterns 200 and 300 which are alternately arranged and disposed along the X direction. In one embodiment, the unit patterns 200 and 300 are shown as a 2X2 color filter array and comprise color filters of red (R), blue (B), and green (G) with different arrangements therein.

Figure 27:
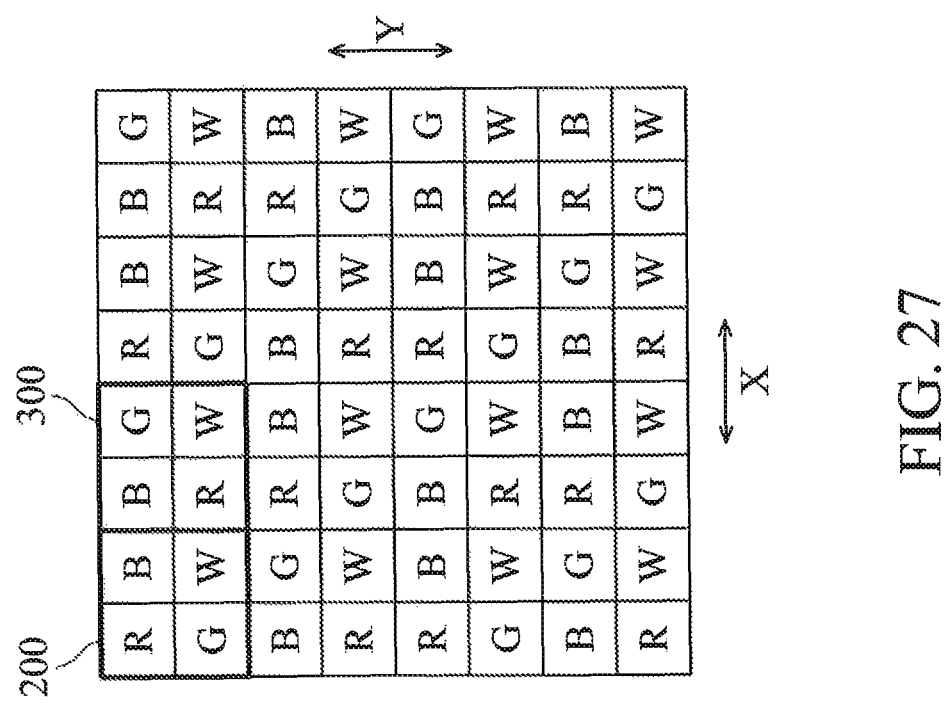
FIG. 27 is a schematic top view showing a color filter array for an image sensing device according to another embodiment of the invention.

FIG. 27 is a schematic top view showing an exemplary color filter array for the image sensing device as shown in FIGS. 1-25. As shown in FIG. 27, the color filter array may comprise a plurality of unit patterns 200 and 300 which are alternately arranged and disposed along the X direction. In one embodiment, the unit patterns 200 and 300 are shown as a 2X2 color filter array and comprise color filters of red (R), blue (B), green (G), and clear/white (W) with different arrangements therein.

However, the image sensing device of the invention may have a color-filter arrangement other than that shown in FIGS. 26-27, and are not limited to that shown in FIGS. 26-27.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image sensing device, comprising:
    a semiconductor substrate with a photo-sensing element;
    a passive layer disposed over the semiconductor substrate, having a first refractive index;
    a color pattern disposed over the passive layer, wherein the color pattern aligns to the photo-sensing element and has a color selected from the group consisting of red (R), green (G), blue (B), and white (W), and a second refractive index; and
    an electromagnetic wave guiding element disposed in at least one of the color pattern and the passive layer, wherein the electromagnetic wave guiding element has a third refractive index, and the third refractive index is greater than the first refractive index or the second refractive index, and a first difference between the third refractive index and the first refractive index is at least 0.2, and a second difference between the third refractive index and the second refractive index is at least 0.2,
    wherein a top surface area of the electromagnetic wave guiding element is substantially equal to or less than a bottom surface area of the electromagnetic wave guiding element.

2. The image sensing device claimed in claim 1, wherein the first difference between the third refractive index and the first refractive index is of about 0.2-1.3, and the second difference between the third refractive index and the second refractive index is of about 0.2-1.3.

3. The image sensing device claimed in claim 1, wherein the electromagnetic wave guiding element has a stud-like, a semicircle-like, or an inverted T-like configuration from a cross sectional view.

4. The image sensing device claimed in claim 1, wherein the electromagnetic wave guiding element has a circular, polygonal, or cross configuration from a top view.

5. The image sensing device claimed in claim 1, wherein the electromagnetic wave guiding element is located over a central portion of the at least one of the color pattern and the passive layer, and the electromagnetic wave guiding element has a first surface area, and the photo-sensing element under the electromagnetic wave guiding element has a second surface area, and a ratio of the first surface area to the second surface area is less than about 25%.

6. The image sensing device as claimed in claim 1, wherein the electromagnetic wave guiding element has a bottom surface level with a bottom surface of the color pattern.

7. The image sensing device as claimed in claim 6, wherein the electromagnetic wave guiding element has a top surface lower than half of a height of the color pattern.

8. The image sensing device as claimed in claim 1, wherein the electromagnetic wave guiding element has a bottom surface level with a bottom surface of the passive layer.

9. The image sensing device as claimed in claim 8, wherein the electromagnetic wave guiding element has a top surface lower than half of a height of the color pattern.

10. The image sensing device as claimed in claim 8, wherein the electromagnetic wave guiding element has a top surface level with a top surface of the passive layer.

11. The image sensing device as claimed in claim 1, further comprising:
    a microlens disposed over the color pattern; and
    an anti-reflection layer disposed over the microlens.

12. The image sensing device as claimed in claim 11, further comprising an under layer disposed between the microlens and the color pattern, having a fourth refractive index.

13. The image sensing device as claimed in claim 12, wherein the electromagnetic wave guiding element is disposed in a portion of the under layer, and the third refractive index is greater than the fourth refractive index, and a third difference between the third refractive index and the fourth refractive index is at least 0.2.

14. The image sensing device as claimed in claim 1, further comprising an anti-reflection layer disposed between the color pattern and the passive layer, having a fifth refractive index.

15. The image sensing device as claimed in claim 14, wherein the electromagnetic wave guiding element is disposed in a portion of the anti-reflection layer, and the third refractive index is greater than the fifth refractive index, and a fourth difference between the third refractive index and the fifth refractive index is at least 0.2.

16. The image sensing device as claimed in claim 1, further comprising an anti-current leakage layer disposed between the color pattern and the passive layer, having a sixth refractive index.

17. The image sensing device as claimed in claim 16, wherein the electromagnetic wave guiding element is disposed in a portion of the anti-current leakage layer, and the third refractive index is greater than the sixth refractive index, and a fifth difference between the third refractive index and the sixth refractive index is at least 0.2.

18. The image sensing device as claimed in claim 1, wherein the electromagnetic wave guiding element comprises light-transmitting materials.

19. The image sensing device as claimed in claim 1, wherein the electromagnetic wave guiding element is disposed in the color pattern and further extends into the passive layer.

20. The image sensing device as claimed in claim 1, wherein the electromagnetic wave guiding element is disposed the passive layer and further extends into the color pattern.

21. The image sensing device as claimed in claim 1, wherein the passive layer includes a light shielding metal formed at a place not covering the photo-sensing element.

* * * * *